United States Patent [19]

Audone et al.

[11] 4,277,744
[45] Jul. 7, 1981

[54] APPARATUS FOR MEASURING ELECTRIC AND MAGNETIC FIELDS

[75] Inventors: Bruno Audone; Luciano Bolla, both of Turin; Giuseppe Gerbi, Caselle Torinese, all of Italy

[73] Assignee: Aeritalia S.p.A. Settore Avionica, Caselle Torinese, Italy

[21] Appl. No.: 973,283

[22] Filed: Dec. 26, 1978

[30] Foreign Application Priority Data

Apr. 13, 1978 [IT] Italy .............................. 67824 A/78

[51] Int. Cl.³ ..................................... G01N 31/02
[52] U.S. Cl. ........................................ 324/72; 324/72.5
[58] Field of Search ........................... 324/72, 72.5, 95

[56] References Cited
U.S. PATENT DOCUMENTS

| | | | |
|---|---|---|---|
| 3,715,660 | 2/1973 | Ruhnke | 324/72 |
| 4,023,093 | 5/1977 | Aslan | 324/95 |
| 4,091,327 | 5/1978 | Larsen | 324/95 |

Primary Examiner—Michael J. Tokar
Attorney, Agent, or Firm—Sughrue, Rothwell, Mion, Zinn & Macpeak

[57] ABSTRACT

Measuring apparatus for providing a reading representing a magnetic field component or the electric field component of incident radio frequency electromagnetic radiation comprises a set of magnetic field sensors and a set of electric field sensors interchangeably connectable to a measuring device which has an indicator instrument and an optical output to which can be connected a repeater device by means of an optical fibre cable which thus does not exert a perturbing influence on the field being measured. The sensors are omnidirectional balanced devices in which the detector elements are constituted by suitably shaped metallic film deposits on dielectric substrates, and can be interchanged by a simple plug-in connection which also holds the sensor physically in position on the measuring device.

20 Claims, 6 Drawing Figures

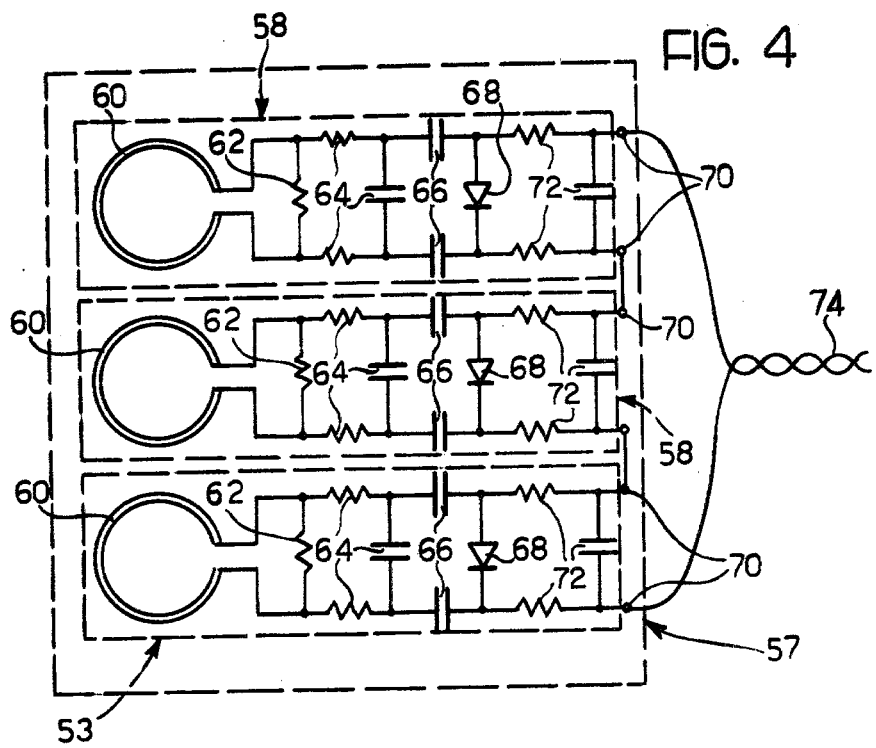
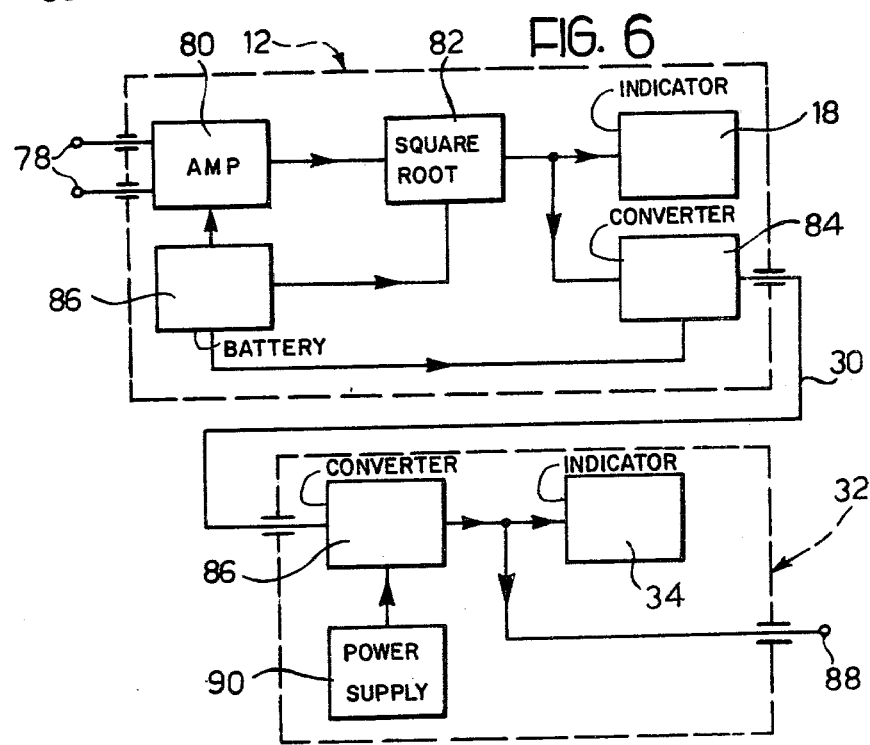

APPARATUS FOR MEASURING ELECTRIC AND MAGNETIC FIELDS

BACKGROUND OF THE INVENTION

The present invention relates to apparatus for measuring electromagnetic radiation, and particularly to apparatus which can be used in the measurement of the degree of risk from electromagnetic radiation, the so-called radiation hazard.

The continuing increase in the number of both civil and military applications of electromagnetic energy at radio frequency means that an ever increasing number of people, especially completely unskilled people, now come into contact with sources of radiation. However, it is known that high intensity electromagnetic radiation can produce harmful biological effects, and since there is no unanimous agreement on the threshold value at which such radiation becomes hazardous the need for measuring apparatus which permits the evaluation in a precise and rapid manner of the intensity of such radiation will be appreciated. Such apparatus can be used both for identifying dangerous environments or regions and for checking on the efficiency of protective screening apparatus.

Various types of apparatus for measuring electromagnetic radiation are currently available commercially. Mostly, such apparatus operates by measuring the power density as is confirmed by the article "quantifing hazardous electromagnetic fields: scientific basis and practical considerations" by P. F. Wacker and R. R. Bowman, appearing in IEEE Transactions on Microwave Theory and Techniques, Volume MTT-19, No. 2, February 1971. Such apparatus, whilst giving results which are satisfactory with plane electromagnetic waves, gives grossly inacurate results when the measurement is made in close proximity to the source of radiation, that is in near-field conditions. This disadvantage is particularly serious since the radiation hazard is very much greater in proximity to the source.

Another serious disadvantage of such apparatus lies in the fact that it is necessary, in general, for the operator to be present during the measurement. This means that the operator is exposed to the radiation being measured and, moreover, the operator's body has a perturbing influence on the form of the electromagnetic field, contributing to distortion of the measurement.

OBJECTS OF THE INVENTION

The primary object of the present invention is to provide apparatus for measuring electromagnetic fields in which accurate readings can be obtained in near-field conditions.

Another object of the invention is to provide apparatus for measuring electromagnetic fields in which the operator does not have to be exposed to the radiation being measured.

A further object of the invention is to provide apparatus for measuring electromagnetic fields which has particular characteristics of simplicity, manageability and economy.

SUMMARY OF THE INVENTION

The above mentioned objects are achieved, according to the invention, by apparatus for the measurement of radiofrequency electromagnetic radiation, including: at least one isotropic, balanced electric field sensor sensitive to the electric field component of incident electromagnetic radiation and responsive thereto to generate an electrical signal dependent on the intensity of the electric field detected; at least one isotropic, balanced magnetic field sensor sensitive to the magnetic field component of incident electromagnetic radiation and responsive thereto to generate an electrical signal dependent on the intensity of the magnetic field detected; a measuring device selectively connectable to one of said at least one electric field sensor and said at least one magnetic field sensor, said measuring device operating to process said electrical signals generated by whichever of said sensors is connected thereto, indicator means of said measuring device operating to indicate the value of said processed signal, which represents the value of whichever of the electric field and the magnetic field to which said one of said sensors connected to said measuring device is sensitive, and a repeater device selectively connectable to said measuring device and operating when so connected to provide a duplicate indication of the indication provided by the said measuring device.

Other features and advantages of the invention will become apparent from a consideration of the following description with reference to the drawings, which is provided purely by way of non-limitative example.

BRIEF DESCRIPTION OF THE DRAWINGS

FIGS. 2 and 4 are schematic electrical circuit drawings of an electric field sensor and of a magnetic field sensor respectively, both suitable to form part of the measuring apparatus of FIG. 1;

FIG. 6 is a block schematic diagram illustrating the electrical aspect of the measuring apparatus of FIG. 1.

DESCRIPTION OF THE PREFERRED EMBODIMENT

Figure 1:
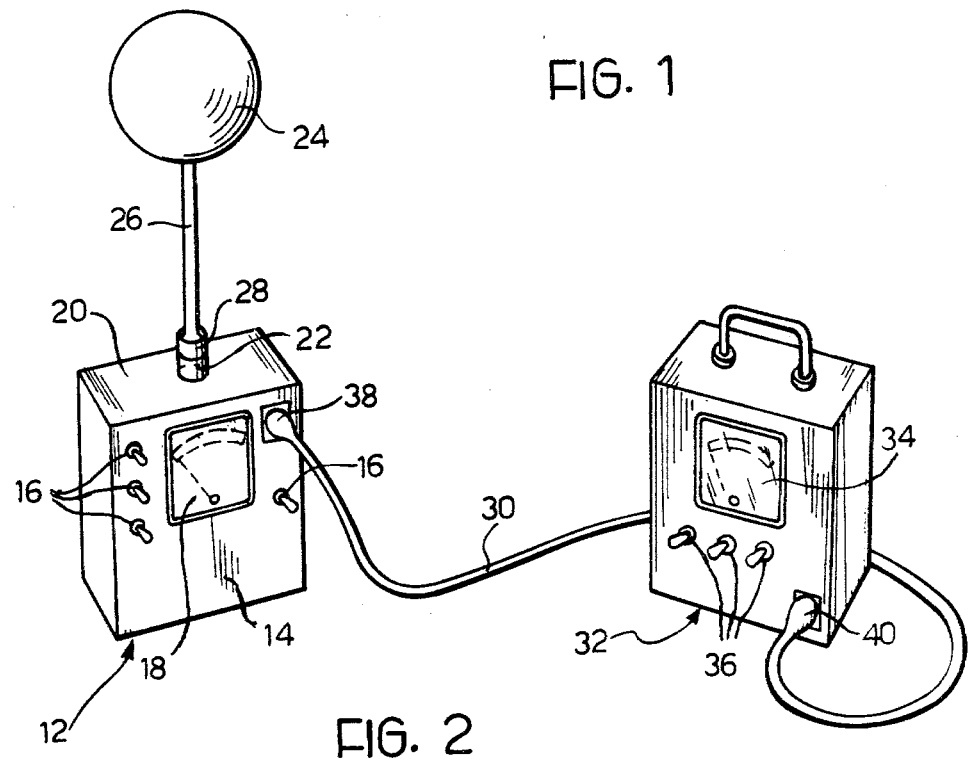
FIG. 1 is a perspective view of measuring apparatus according to the invention, connected to one of its sensors.

In FIG. 1 there is shown apparatus for measuring radiation hazard comprising a measuring device 12 to which is fitted a sensor housed in a spherical casing 24. The measuring device is contained in a generally rectangular metal casing the dimensions of which are such that it is readily portable. In the embodiment to be described herein the dimensions of the casing are in the region of 15×15×8 centimeters.

The front face 14 of the casing is provided with a set of control switches 16 and with an indicator instrument 18. The top 20 of the container is provided with an input connector socket 22 to the interior of which are connected the input terminals of the measuring device 12.

The measuring apparatus is in fact provided with a plurality of interchangeable electric field sensors and a plurality of interchangeable magnetic field sensors selectively connectable to the measuring device 12 by means of the input connector 22. The different sensors have different characteristics and are selected for use in dependence on the characteristics of the radiation measurement to be effected.

Each sensor is contained in a spherical protective casing 24 which is made of a material transparent to the electromagnetic radiation to be sensed, and is carried at one end of a rigid arm 26, of tubular hollow form. The other end of the arm 26 is provided with a connector plug 28 electrically connected to the sensor at the said one end of the arm by means of a pair of wires passing through the hollow interior of the arm 26 itself.

The plug 28 is shaped such that it is suitable to be connected to the input connector 22 of the measuring device 12. The plug and socket connection between the input connector socket 22 of the measuring device 12 and the connector plug 28 of the arm 26 serves both an electrical and a mechanical purpose: it electrically connects the sensor 24 supported by the arm 26 with the input terminals of the measuring device 12 and at the same time maintains the sensor in the required physical position spaced a given distance from the top 20 of the measuring device 12, that is equal to the length of the support arm 26.

A cable of optical fibres 30 allows the connection of the measuring device 12 with a repeater device 32, which is also portable, (with casing dimensions in the region of 15×15×8 centimeters) and which is also provided with an indicator instrument 34 and with control switches 36 on a front face thereof. The optical fibre cable 30 is provided at its ends with connector plugs 38, 40 for connection into respective cooperating connector sockets provided on the measuring device 12 and the repeater device 32.

The different sensors with which the measuring apparatus is provided are either electric field sensors or magnetic field sensors and the choice of which particular sensor to use will depend on the frequency and intensity of the electric or magnetic field which it is intended to measure. Each electric or magnetic sensor is adapted to sense electric or magnetic fields within a given frequency range and of a given intensity range, characteristic for each sensor. Both the electric field sensors and the magnetic field sensors provide an output voltage signal proportional to the intensity of the electric or magnetic field sensed, with an output power range which is substantially the same for all the sensors. Moreover, all the sensors are of the isotropic (that is non-directional) and balanced type as will be described in greater detail below.

Figure 2:
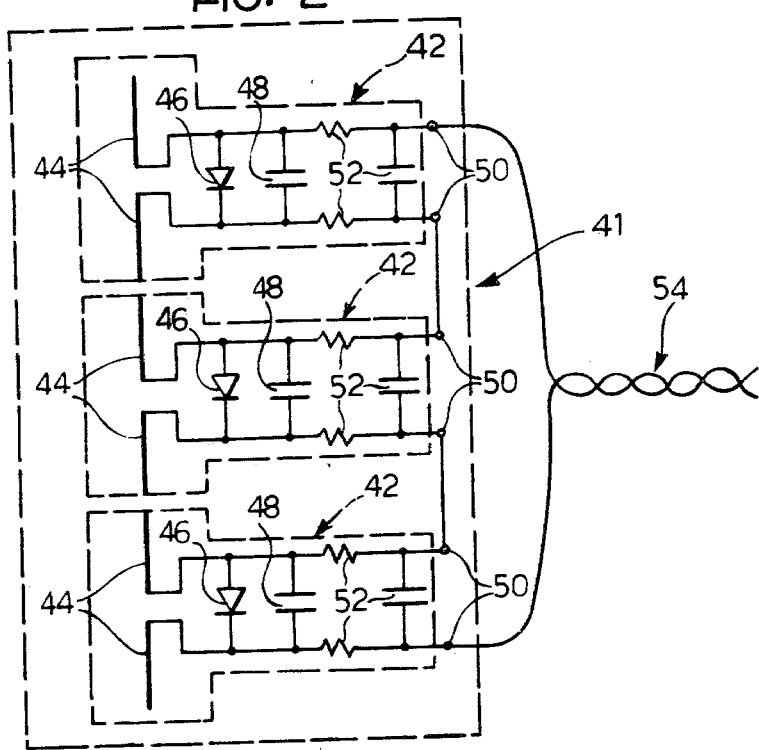

Because the sensors are non-directional the measurement is substantially independent of the angle of incidence of the electromagnetic radiation on the sensor, thereby allowing correct results even in the case of near-field measurements and in highly reflective environments. Moreover, the balanced configuration of the sensors, by automatically compensating in a large part for the effects of the parasitic coupling capacitance, greatly reduces the deleterious effect on the precision of the measurement due to bodies surrounding the sensor and the measuring device when in use, which bodies may include the operator. The electric field sensors are each constituted by three directional electric field detectors, disposed in such a way that each detects the incident electric field in one of three orthogonal directions. FIG. 2 illustrates the schematic electrical circuit of one of the electric field sensors, generally indicated with the broken line 41. All the electric field sensors of the measuring apparatus have substantially the same circuit as that shown in FIG. 2 indicated by respective broken lines 42. Each detector 42 includes an electric dipole 44; the three dipoles 44 are physically disposed with their axes orthogonal to one another.

The electric field incident on each dipole 44 is detected by a detector circuit constituted by a detector diode 46 of the zero-bias type connected in parallel with a shunt capacitor 48. The capacitor 48 ensures that the output power of the sensor is adapted to the input impedance of the measuring device 12 and, in the frequency range of the sensor, renders the response of the dipole 44 substantially independent of frequency. Between the detector circuit 46, 48 and the output 50 of the directional sensor 42 is interposed R.C. filter 52 which passes only the continuous component of the e.m.f. detected.

The outputs 50 of the directional sensors 42 are connected together in series and feed to the measuring device 12, via a pair of twisted wires 54, a substantially d.c. voltage which is substantially proportional to the intensity of the entire incident electric field. More exactly, the voltage generated by the sensor as a whole, because of the detection characteristic of the detector diodes 46, is substantially proportional to the square of the intensity of the entire incident electric field.

Figure 3:
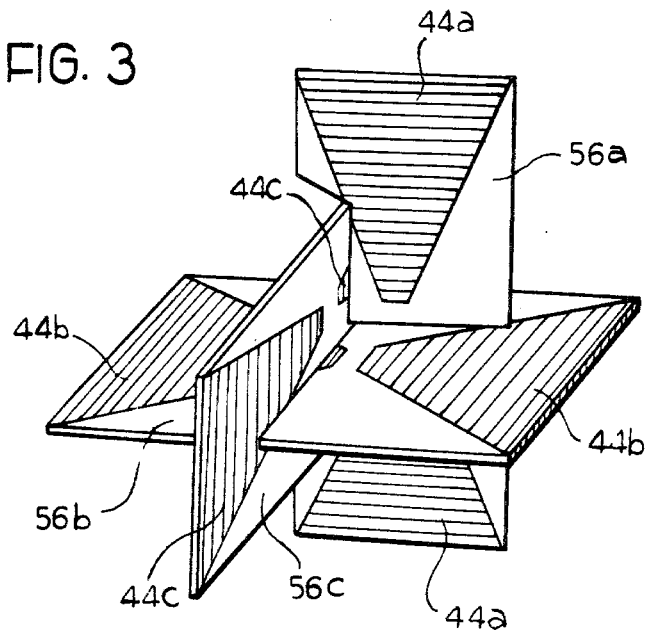
FIGS. 3 and 5 are schematic perspective views of an electric field sensor and a magnetic field sensor respectively, both suitable to form part of the measuring apparatus of FIG. 1.

In FIG. 3 the physical form of an isotropic electric field sensor is shown schematically; the dipoles of the sensor are constituted by pairs of triangular metal dipole elements 44a, 44b, 44c formed by metal deposited on respective plane support plates 56a, 56b, 56c of dielectric material, in the case in question vetronite. The three support plates 56a, 56b, 56c are of substantially rectangular form and are provided with cut-outs in such a way that they can be fitted into one another mutually orthogonally. The triangular form of the metal dipole elements gives the sensor a high sensitivity.

For sensors of lower sensitivity, the dipole elements are still constituted by a metal deposit on a dielectric support plate, but have a thin, elongate, substantially rectangular form.

Apparatus such as that hereinabove described would be provided for example with three electric field sensors of the type described above, operating in the same frequency range and in contiguous intensity ranges with an output gain of 20 dB.

The magnetic field sensors are likewise isotropic and balanced; each of these is constituted by three directional, magnetic field detectors, disposed in such a way as to sense three orthogonal components of an incident magnetic field. FIG. 4 is a schematic electric circuit diagram of a magnetic field sensor generally indicated 57; in FIG. 4 the three directional magnetic detectors which constitute the sensor are indicated 58. Each directional magnetic field detector 58 comprises a coil 60 provided with one or more turns according to the required sensitivity of the sensor, and disposed with its axis orthogonal to the axis of the other two coils. Across each coil 60 there is connected a respective resistor 62 in parallel with which is connected an RC network the values of the components of which are selected to match the dynamic output impedance of the sensor to the input impedance of the measuring device 12; the RC network also renders the measurement independent of frequency. In cascade with the RC network 64 there is connected a detector circuit constituted by two capacitors 66 and a detector diode 68 of the zero-bias type. Between the detector circuit 66, 68 and the output 70 of each directional detector 58 is interposed an RC filter 72 the function of which is analogous to that of the RC filter 52 of the directional electric detectors 42. The outputs 70 are connected in series with one another and, by means of two twisted wires 74, to the input of the measuring device 12; the output of the sensor is a substantially d.c. voltage signal which is substantially proportional to the square of the intensity of the entire incident magnetic field. The coils 60 are screened from the incident electric field by means of a screen (not shown) connected electrically to the body of the measuring apparatus. The turn or turns of each coil 60 is or are formed by depositing one or more circular tracks of metallic material on to a dielectric support, in the present case vetronite.

Figure 5:
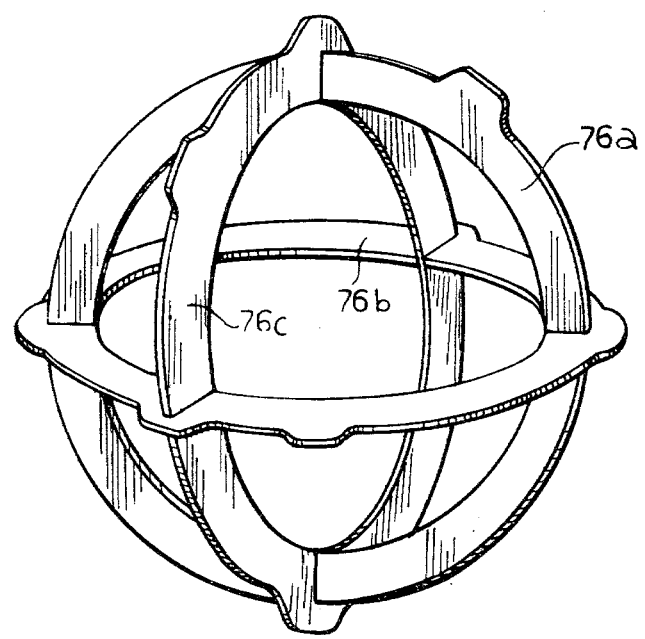

FIG. 5 shows the physical form of the magnetic field detectors. In FIG. 5 the three dielectric supports, indicated 76a, 76b, 76c of an isotropic sensor are shown. These supports are of plane annular form; each is provided with projections and cut-outs which allow it to be fitted together with the other supports in a mutually orthogonal configuration.

Apparatus such as that herein described would be provided, for example with two magnetic field sensors of the type described above, operating in the same intensity range and in contiguous frequency ranges such as to cover completely a wide frequency range.

FIG. 6 is a block schematic diagram of the measuring apparatus. The measuring device 12 is provided with two input terminals 78 which, as mentioned above, terminate at the input connector 22. The two input terminals 78 are thus fed, in use, by whichever sensor is connected at the time to the input connector 22. The measuring device 12 is substantially a dc volt meter with a balanced input and fixed input impedance which matches the output power of the sensors. The input terminals 78 are connected to a differential chopper amplifier 80 of high independence, which amplifies the signal fed from the sensors and filters from it any residual alternating component. The output of the amplifier 80 feeds a square root extractor circuit 82, which generates at its output an electric signal which is then fed to the indicator instrument 18. This latter electric signal is also passed to an electro-optical converter 84. The power for running the measuring device 12 is drawn from battery feed unit 86.

The differential amplifier 80, being of the "chopper" type, makes the effect of thermal drift on the precision of measurement negligible, and makes it unnecessary to perform periodic zero—adjustment operations on the indicator instrument 18. The square root extractor 82 is an integrated circuit of multifunction type (a so-called multifunction converter). It performs, in effect, the opposite arithmetic operation from that performed by the detector diodes 46, 68, so that the signal fed to the indicator instrument 18, and to the electro-optical converter 84, is an electric signal directly proportional to the intensity of the electric or magnetic field sensed by the sensor connected to the measuring device 12. This allows the indicator instrument 18 to utilise a substantially linear scale in place of the quadratic scale which would have been necessary if the square root extractor were not provided. The use of a linear scale obviously allows a greater reading accuracy toward the lower end of the scale.

The electro-optical converter 84 operates to convert the electrical signal generated by the square root extractor 82 into an optical signal proportional thereto, this optical signal can be transmitted by means of the optical fibre cable 30 (if plugged in) to the repeater 32. This latter includes an opto-electrical converter 86 which generates an electrical signal proportional to the optical signal transmitted to it from the measuring device 12 and feeds this electrical signal to the indicator instrument 34 and to an analogue output 88. The repeater 32 does not have to be battery operated and, in fact, can be supplied by a main voltage power supply unit 90.

The repeater 32 provides a duplicate reading of the measurement made by the measuring device 12, and because it can be placed a considerable distance from the measuring device 12 (ten meters or more) it allows the operator to monitor the measurement in a different environment from that in which the measurement itself is taking place. In this way the necessity for the operator to be directly exposed to the electromagnetic radiation being measured is avoided. At the same time the measurement errors due to perturbations of the field resulting from the presence of the operator himself are also eliminated. The optical fibre cable 30 does not produce perturbations of the field and, being electrically separate from the apparatus, contributes to the maintainance of a high precision of measurement.

The analogue output 88 permits the electrical signal generated by the opto-electrical converter 86 to be fed to an external recording and/or processing unit. It can in fact be important to record the time and variation of the values of the measurements made, especially when undertaking the evaluation of the radiation hazard from radiofrequency electromagnetic radiation.

The control switches 16 with which the measuring device 12 are provided allow among other things, the verification of the state of the batteries and the testing of the measuring device 12 for proper functioning.

The range of applications of measuring apparatus such as that described above is very wide, and varies from the measurement of radiofrequency interference to the operations of evaluation and calibration of RF antennae; it can also be used for plotting the radiation patterns of antennae, for testing the efficiency of screening and for monitoring the electromagnetic field prior to the installation of apparatus sensitive to radiofrequencies.

Particular importance is attached to the use of the apparatus described above in the measurement of electromagnetic radiation with a view to evaluating the radiation hazard to personnel. With regard to this measurement, the possibility offered by the apparatus of the invention of evaluating directly and seperately the intensity of the electric field and the intensity of the magnetic field, rather than the overall power density of the radiation, allows the avoidance of errors, especially in measurements effected in near-field conditions.

Having particularly described one embodiment of the invention, those skilled in the art will appreciate that many variations and alterations to what has been described and illustrated herein can be made without by this departing from the spirit and scope of the present invention.

We claim:

1. Apparatus for the measurement of radio frequency electromagnetic radiation, including:
    at least one isotropic, balanced electric field sensor sensitive to the electric field component of incident electromagnetic radiation and responsive thereto to generate an electrical signal dependent on the intensity of the electric field detected;
    at least one isotropic, balanced magnetic field sensor sensitive to the magnetic field component of incident electromagnetic radiation and responsive thereto to generate an electrical signal dependent on the intensity of the magnetic field detected:
    each of said at least one electric field sensor and magnetic field sensor having detector circuitry connected thereto, said detector circuitry including a detector diode of the zero bias type, said detector circuitry thereby providing electrical signals substantially independent of the frequency of the field detected;

a measuring device selectively connectable to one of said at least one electric field sensor and said at least one magnetic field sensor, said measuring device operating to process said electrical signals generated by whichever of said sensors is connected thereto, and to produce a processed signal representative of the value of one of the real electric field in terms of volts per meter and the real magnetic field in terms of magnetic potential per meter, depending on which of said sensors is connected thereto, indicator means of said measuring device operating to indicate the value of said processed signal, which represents the value of whichever of the real electric field in terms of volts per meter and the real magnetic field in terms of magnetic potential per meter to which said one of said sensors connected to said measuring device is sensitive, and a repeater device selectively connectable to said measuring device and operating when so connected to provide a duplicate indication of the indication provided by said measuring device.

2. Measuring apparatus as in claim 1, wherein an optical fibre cable is provided to connect said repeater device to said measuring device.

3. Measuring apparatus as in claim 1, wherein there are provided a plurality of said electric field sensors and a plurality of said magnetic field sensors, each said sensor operating in a respective frequency range and with a respective measurement sensitivity.

4. Measuring apparatus as in claim 3, wherein said plurality of electric field sensors each have substantially the same frequency range and are sensitive to substantially contiguous intensity ranges.

5. Measuring apparatus according to claim 1, wherein each said electric field sensor comprises three directional electric field detectors each including a dipole, means connecting the outputs of said three directional electric field detectors together in series; and means mounting said dipoles of said electric field detectors orthogonally with respect to one another.

6. Measuring apparatus as in claim 3, wherein said magnetic field sensors each have substantially the same sensitivity and operate in different frequency ranges.

7. Measuring apparatus as in claim 1, wherein each said magnetic field sensors comprises three directional magnetic field detectors each including a coil, means connecting the outputs of said three directional magnetic field detectors together in series, and means for mounting said three coils of said directional magnetic field detectors in such a way that their axes are orthogonal to one another.

8. Measuring apparatus as in claim 7, wherein each directional magnetic field detector further includes a plurality of detector circuits connected to respective coils, each said detector circuit including a detector diode of the zero-bias type.

9. Measuring apparatus as in claims 1 or 3, wherein said electric field sensors and said magnetic field sensors have substantially the same output power, the value of which substantially matches the input impedance of said measuring device.

10. Measuring apparatus as in claims 1, 6 or 8, wherein said measuring device includes:

a differential amplifier operating to amplify the electric signal fed from whichever of said sensors is connected to said measuring device;

a square root extractor circuit connected to the output of said differential amplifier and operating to generate an electrical signal the amplitude of which is equal to the square root of the amplified signal from said differential amplifier and therefore directly proportional to the intensity of the electric or magnetic field sensed by whichever sensor is connected to said measuring device;

an indicator instrument connected to the output of said square root extractor circuit and operating to provide a visual display representing the value of said signal generated by said square root extractor circuit, and an electro-optical converter connected to the output of said square root extractor circuit and operating to convert said electrical signal generated by said square root extractor circuit into an optical signal proportional thereto.

11. Measuring apparatus as in claim 10, wherein said measuring device is battery operated.

12. Measuring apparatus as in claim 10, wherein the differential amplifier is a chopper amplifier having low thermal drift.

13. Measuring apparatus as in claim 11, wherein said measuring device is provided with means for testing the state of the battery and for testing the operation of the measuring device.

14. Measuring apparatus as in claim 10, wherein said repeater device includes:

an opto-electrical converter device operating to convert the optical signal generated by said electro-optical converter of said measuring device into an electrical signal proportional thereto, an indicator instrument operating to provide a visual display representative of the electrical signal generated by said opto-electrical converter, and an analogue output to which is fed an electrical signal the value of which depends on the value of the electric signal generated by said opto-electrical converter.

15. Measuring apparatus as in claim 14, wherein said repeater device is fed by a main feed.

16. Measuring apparatus as in claim 1, wherein said measuring device and said repeater device are each contained in respective metal casings and are of such a size as to be portable.

17. Measuring apparatus as in claim 1, wherein each of said electric field sensors and said magnetic field sensors is carried at one end of a respective rigid arm of tubular form; the other end of the each said arm being provided with connector means electrically connected to the output of the respective sensor.

18. Measuring apparatus as in claim 17, wherein said measuring device is housed in a casing having an input connector electrically connected to the input of the measuring device itself; said input connector being shaped to co-operate with said connector of said support arm of each of said sensors, whereby electrical connection of a said sensor is obtained with physical support of said support arm thereof upon connection of said connector thereof to said input connector of said measuring device.

19. Measuring apparatus as in claim 5, wherein said electric dipoles are formed by dipole elements constituted by a metal film deposited on a plane dielectric support.

20. Measuring apparatus as in claim 7, wherein said coils are formed by tracks constituted by a metal film deposited on a dielectric support.

* * * * *